United States Patent
Elsherbini et al.

(10) Patent No.: US 11,004,824 B2
(45) Date of Patent: May 11, 2021

(54) SCALABLE EMBEDDED SILICON BRIDGE VIA PILLARS IN LITHOGRAPHICALLY DEFINED VIAS, AND METHODS OF MAKING SAME

(71) Applicant: Intel Corporation, Santa Clara, CA (US)

(72) Inventors: Adel A. Elsherbini, Chandler, AZ (US); Henning Braunisch, Phoenix, AZ (US); Javier Soto Gonzalez, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/389,100

(22) Filed: Dec. 22, 2016

(65) Prior Publication Data

US 2018/0182707 A1    Jun. 28, 2018

(51) Int. Cl.
*H01L 25/065* (2006.01)
*H01L 23/00* (2006.01)
*H01L 23/538* (2006.01)

(52) U.S. Cl.
CPC ...... *H01L 25/0655* (2013.01); *H01L 23/5383* (2013.01); *H01L 24/17* (2013.01); *H01L 24/81* (2013.01); *H01L 23/5385* (2013.01); *H01L 2224/1403* (2013.01); *H01L 2224/16113* (2013.01); *H01L 2224/16227* (2013.01); *H01L 2224/16235* (2013.01); *H01L 2224/1703* (2013.01)

(58) Field of Classification Search
CPC ....... H01L 2924/00014; H01L 2924/00; H01L 2924/014; H01L 2924/0105; H01L 2924/00012
See application file for complete search history.

(56) References Cited

U.S. PATENT DOCUMENTS

| | | | |
|---|---|---|---|
| 7,402,901 B2 | 7/2008 | Hatano | |
| 8,008,764 B2 | 8/2011 | Joseph | |
| 8,796,846 B2 * | 8/2014 | Lin | H01L 21/6835 257/686 |
| 2014/0332966 A1 | 11/2014 | Xiu et al. | |
| 2015/0318236 A1 * | 11/2015 | Zhang | H01L 23/49838 257/773 |
| 2015/0364423 A1 | 12/2015 | Liu | |

(Continued)

FOREIGN PATENT DOCUMENTS

| EP | 2731134 A1 | 5/2014 |
|---|---|---|
| KR | 101436980 B1 | 9/2014 |

OTHER PUBLICATIONS

"International Application Serial No. PCT/US2017/062767, International Search Report dated Mar. 12, 2018", 3 pgs.

(Continued)

*Primary Examiner* — Tony Tran
(74) *Attorney, Agent, or Firm* — Schwabe, Williamson & Wyatt P.C.

(57) ABSTRACT

An embedded silicon bridge system including tall interconnect via pillars is part of a system in package device. The tall via pillars may span a Z-height distance to a subsequent bond pad from a bond pad that is part of an organic substrate that houses the embedded silicon bridge.

24 Claims, 9 Drawing Sheets

(56) References Cited

U.S. PATENT DOCUMENTS

2016/0056102 A1 2/2016 Konchady et al.
2016/0093597 A1* 3/2016 Chang .................... H01L 24/24
                                                    257/737

OTHER PUBLICATIONS

"International Application Serial No. PCT/US2017/062767, Written Opinion dated Mar. 12, 2018", 10 pgs.
International Preliminary Report on Patentability for International Patent Application PCT/US2017/062767 dated Jul. 4, 2019, 12 pgs.

* cited by examiner

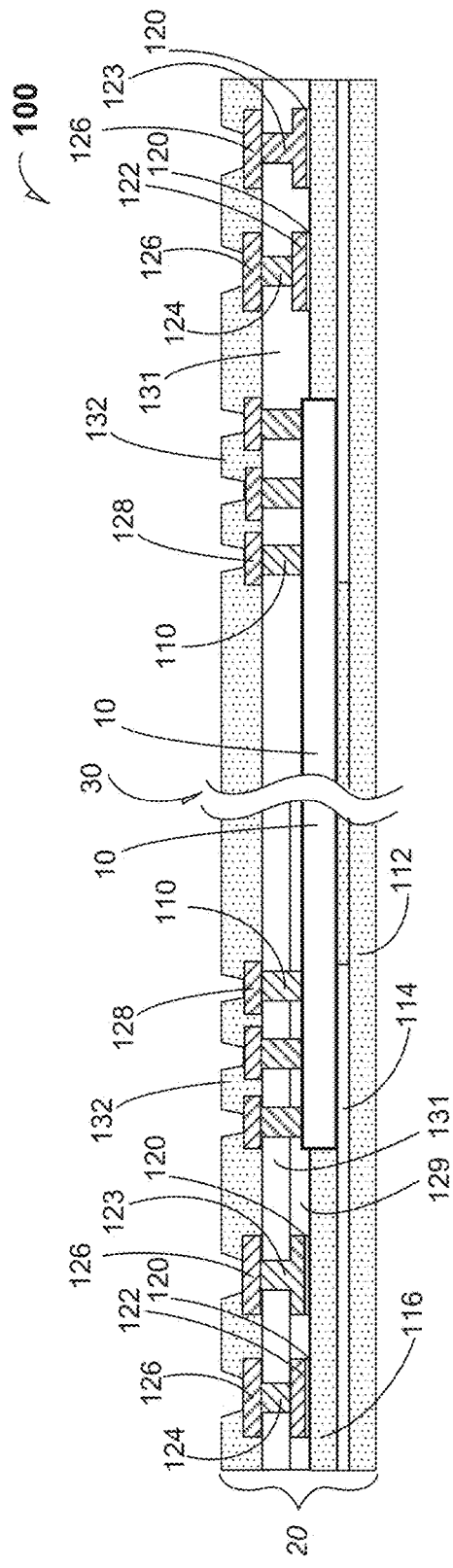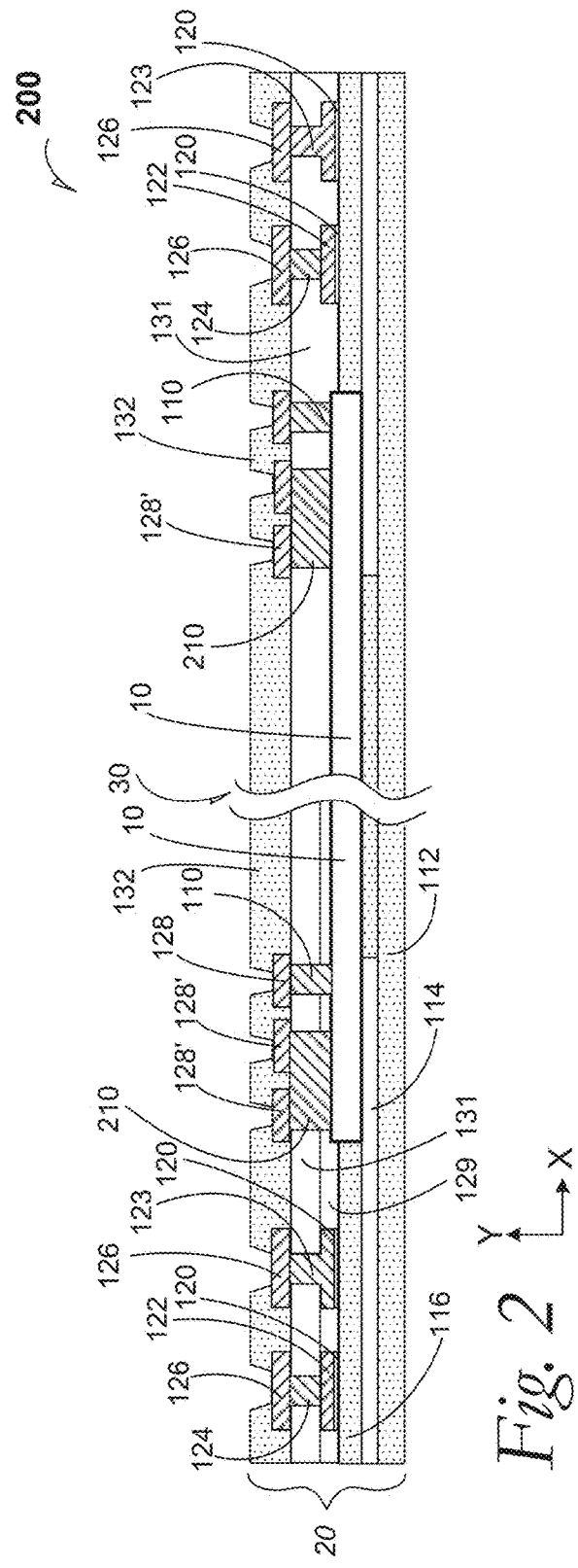

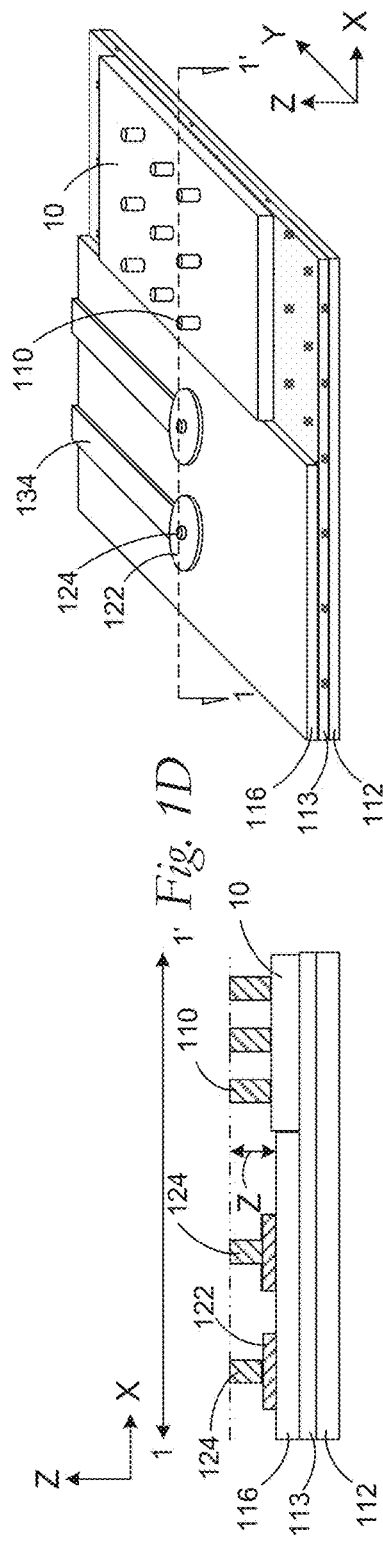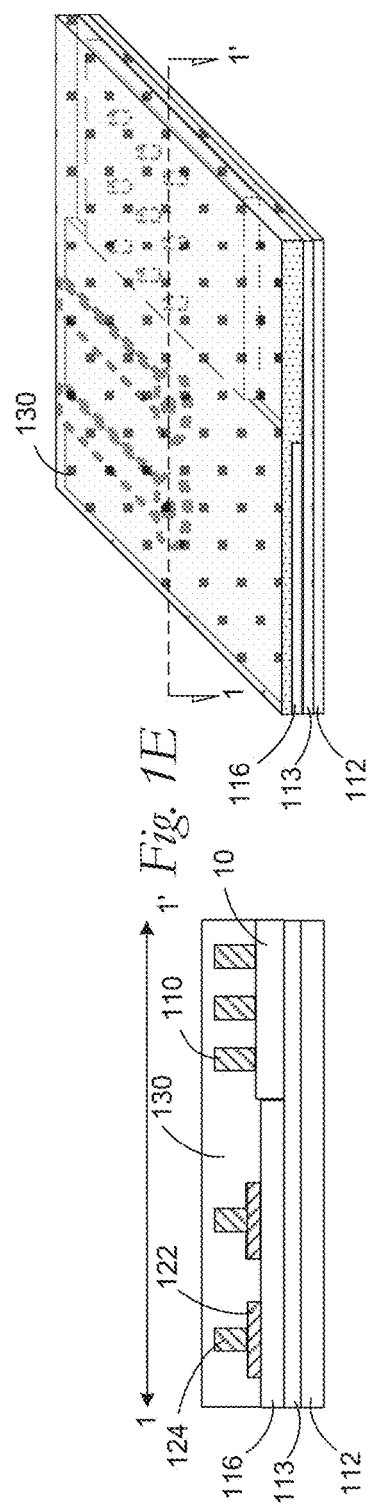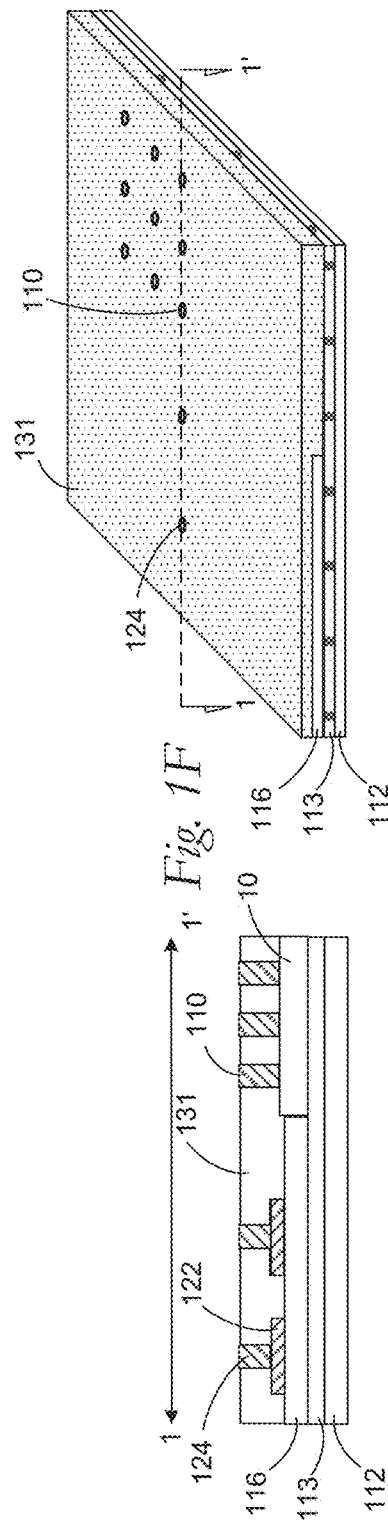

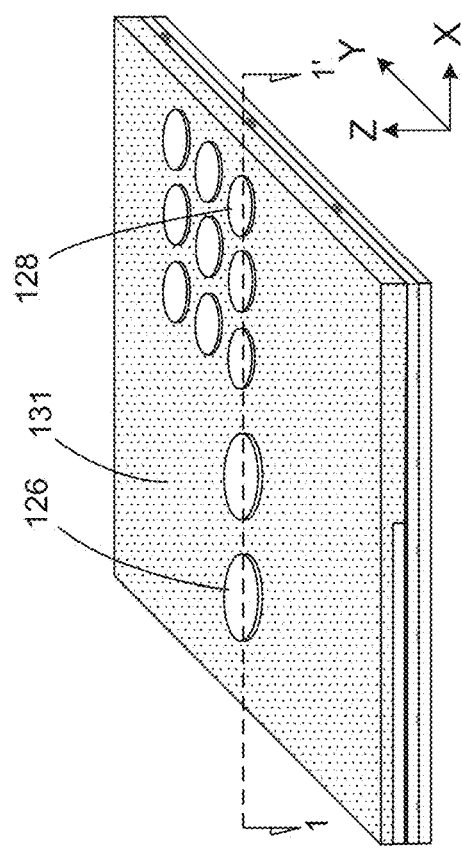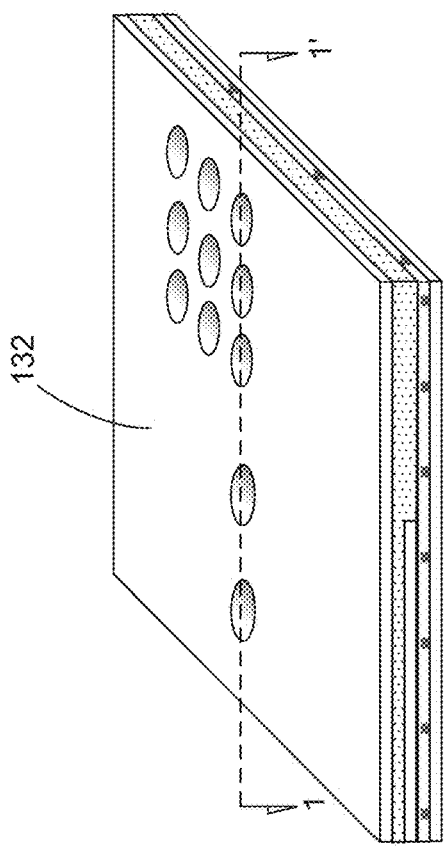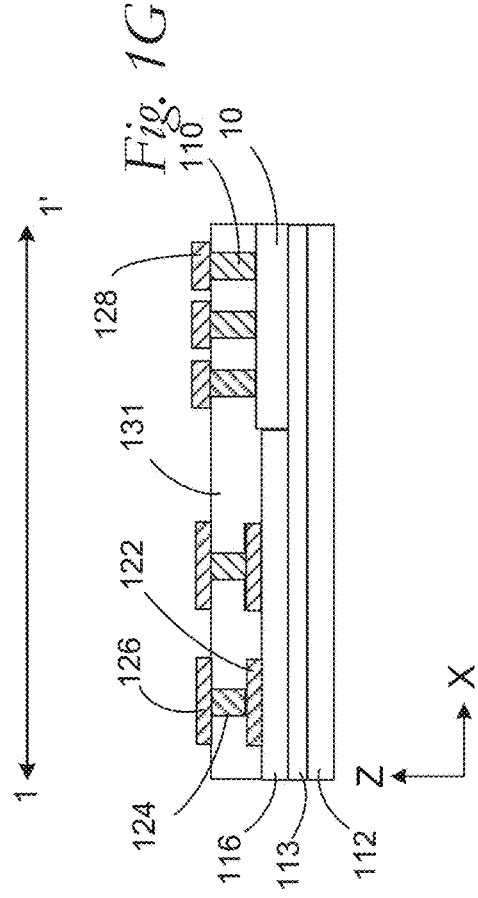
Fig. 1G
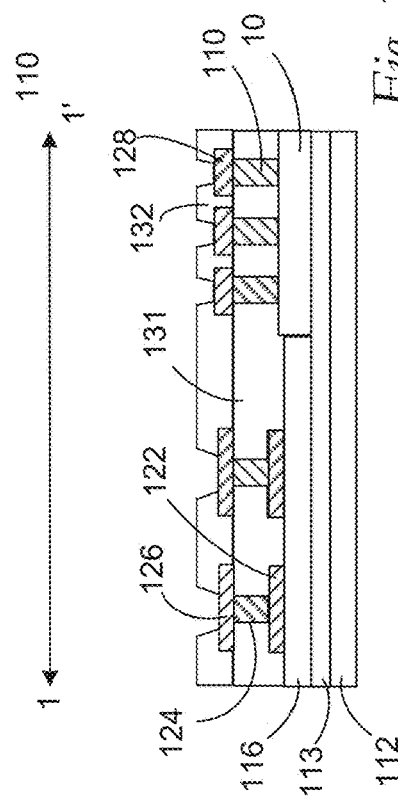
Fig. 1H

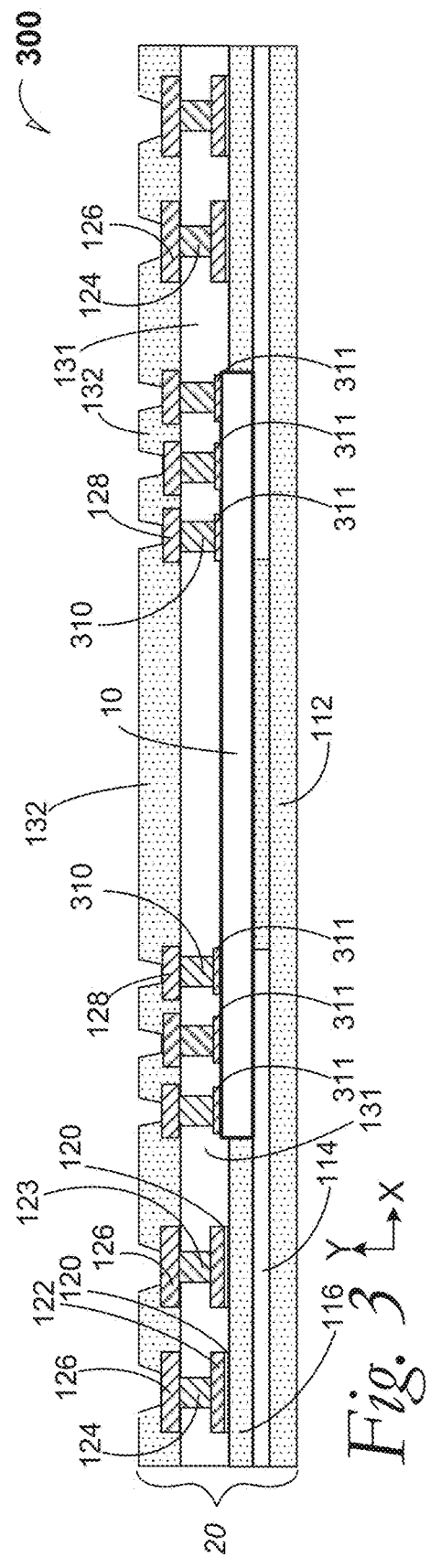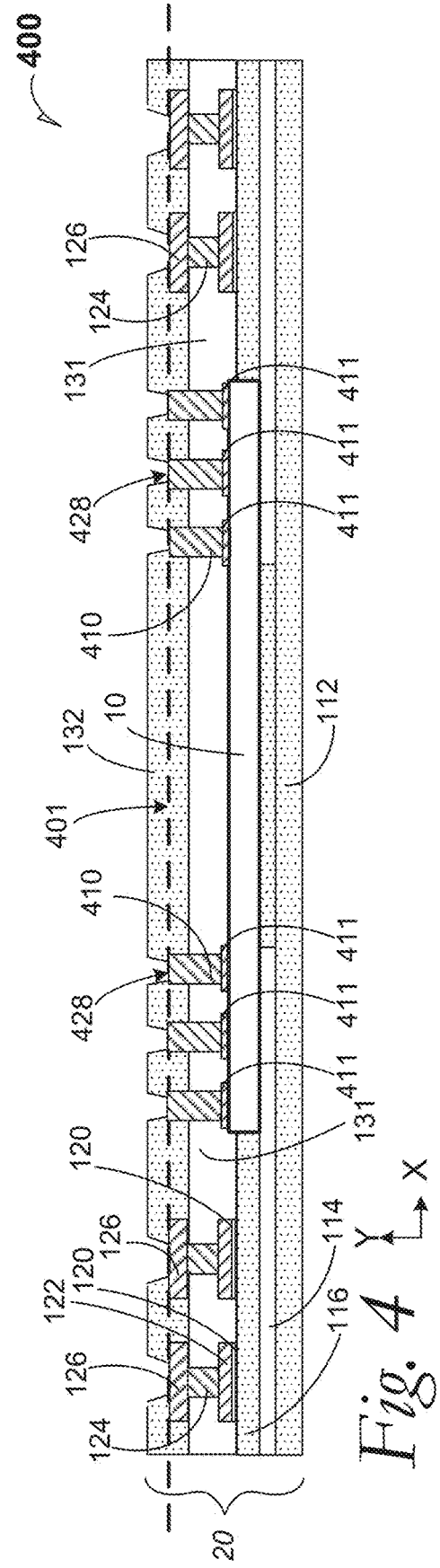

SCALABLE EMBEDDED SILICON BRIDGE VIA PILLARS IN LITHOGRAPHICALLY DEFINED VIAS, AND METHODS OF MAKING SAME

FIELD

This disclosure relates to embedded silicon bridge interconnects for system-in-package (SiP) devices including stacked chip configurations.

BACKGROUND

Computing devices such as mobile telephones, smart phones and tablet computers are restricted in available space because there are size limitations dictated by intended use. Size reduction presents challenges for packaging, both in height and in footprint. Interconnections between in-package devices are also challenged to being size-reduced without compromising performance.

BRIEF DESCRIPTION OF THE DRAWINGS

Various disclosed embodiments are illustrated by way of example, and not by way of limitation, in the figures of the accompanying drawings and in which:

FIG. 1 is a cross-section elevation of an embedded silicon bridge with tall via pillars according to an embodiment;

FIG. 1D includes cross-section and perspective elevations of the embedded-bridge device depicted in FIG. 1C after further processing according to an embodiment;

FIG. 1E includes cross-section and perspective elevations of the embedded-bridge device depicted in FIG. 1D after further processing according to an embodiment;

FIG. 1F includes cross-section and perspective elevations of the embedded-bridge device depicted in FIG. 1E after further processing according to an embodiment;

FIG. 1G includes cross-section and perspective elevations of the embedded-bridge device depicted in FIG. 1F after further processing according to an embodiment;

FIG. 1H includes cross-section and perspective elevations of the embedded-bridge device depicted in FIG. 1G after further processing according to an embodiment;

FIG. 2 is a cross-section elevation of an embedded silicon bridge with ganged via pillars according to an embodiment;

FIG. 3 is a cross-section elevation of an embedded silicon bridge with bond-pad-on-bridge reinforced tall via pillars according to an embodiment;

FIG. 4 is a cross-section elevation of an embedded silicon bridge with bond-pad-on-bridge reinforced tall via pillars that match a metallization subsequent pad height according to an embodiment;

DETAILED DESCRIPTION

Figure 1A:
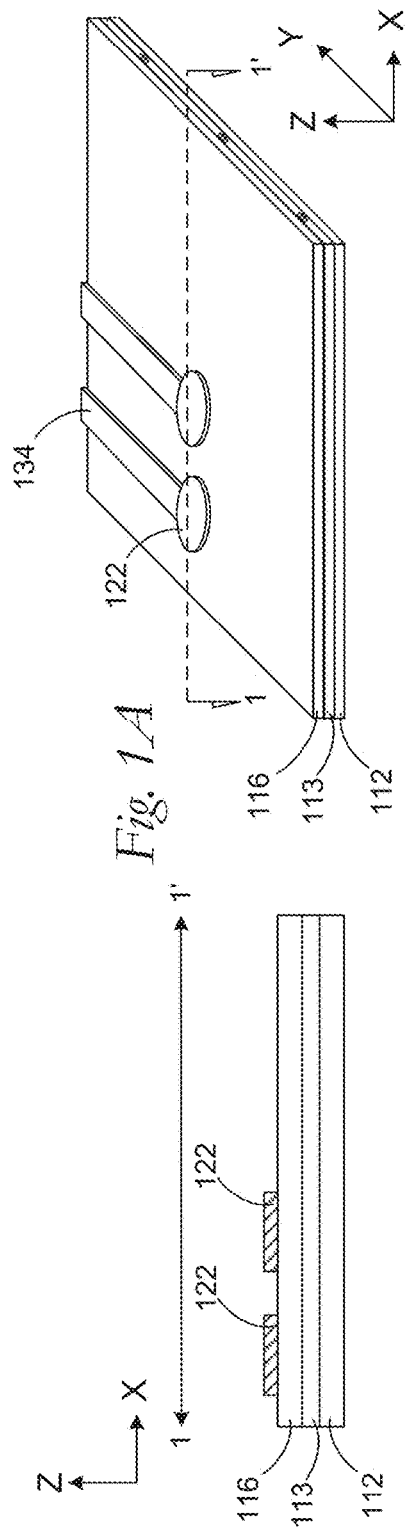
FIG. 1A includes cross-section and perspective elevations of the embedded-bridge device depicted in FIG. 1 during processing according to an embodiment.

A high-density interconnect is achieved to bridge between different semiconductor devices in an organic package according to several disclosed embodiments. This high-density interconnect is useful such as for a high-bandwidth memory interface according to an embodiment. This high-density interconnect is useful such as for a die-stitching interface according to an embodiment. Other high-density uses may be employed. The disclosed embodiments eliminate the need for a silicon interposer solution among others.

FIG. 1 is a cross-section elevation of a scalable embedded silicon bridge 100 with via pillars according to an embodiment. An embedded semiconductive bridge 10 (hereinafter, "silicon bridge") is disposed within an organic substrate 20. In an embodiment, the bridge 10 is a planar inorganic substrate. In an embodiment, the bridge 10 is a glass material. The via pillar 110 extends from the active surface of the silicon bridge 10. In an embodiment, silicon bridge 10 has been seated with pre-existing via pillars 110 during fabrication of the organic substrate 20. Illustrated in FIG. 1 are six pre-existing, via pillars 110, grouped in threes at the margins of the silicon bridge 10 as illustrated in this cross-section along the X-direction. In an embodiment, the pre-existing via pillars 110 have a Y-X aspect ratio greater than 1:1. In an embodiment, the pre-existing via pillars 110 have a Y-X aspect ratio less than 1:1. In an embodiment, the pre-existing via pillars 110 have a Y-X aspect ratio less than or equal to 10:1. In an embodiment, the pre-existing via pillars 110 have a Y-X aspect ratio in a range from 9:1 to 2:1. In an embodiment, the pre-existing via pillars 110 have a Y-X aspect ratio in a range from 8:1 to 3:1. In an embodiment, the pre-existing via pillars 110 have a Y-X aspect ratio in a range from 7:1 to 4:1. In an embodiment, the pre-existing via pillars 110 have a Y-X aspect ratio in a range from 6:1 to 5:1.

The organic substrate 20 may have a base layer 112 and a first trace layer 114. In an embodiment, a bridge-level organic layer 116 has been milled to create a recess 118 (see FIG. 1C) into which the silicon bridge 10 has been seated.

Attention is directed in FIG. 1 to the left side, from an arbitrary break 30 that is shown to assist illustrating selected process embodiments.

Attention is directed to items called out in FIG. 1 at the left side including structures touching the item indicated with reference numeral 124. In an embodiment, a substrate-base interconnect includes a seed layer 120, a first bond pad 122, a first via 124, and a subsequent bond pad 126. The first via 124 is above and on the subsequent bond pad 122 and it extends orthogonally from the first bond pad within ordinary processing parameters. The first bond pad 122 has been plated upon the seed layer 120, and the first via 124 that has been formed on the first bond pad 122 by a semi-additive plating technique. In an embodiment, photolithography techniques are used to first form the first bond pad 122 by patterning a first dielectric layer 129, followed by plating such as electroplating the first bond pad 122 onto the seed layer 120. In an embodiment, the first dielectric layer 129 is first formed and patterned for the first bond pad 122 but at a Z-height that protects the pre-existing, tall via pillars 110 during plating of the first bond pad 122. Thereafter, the first dielectric layer 129 is height reduced such as by wet etching, plasma etching, mechanical grinding, or reactive-ion etching (RIE) to achieve the first dielectric layer 129 as depicted, such that the etch is selective to leaving the first bond pad 124 and the pre-existing via pillars 110. Next, semi-additive plating is done by forming and patterning a second dielectric layer 131 that may also cover the pre-existing via pillars 110 during plating of the first via 124, followed by another etch that height-reduces the second dielectric layer 131 that exposes and stops at the Z-height of both the first via 124 and the tops of the pre-existing via pillars 110. Thereafter, the subsequent bond pad 126 is formed by patterning a subsequent dielectric layer (not illustrated), followed by plating the subsequent bond pad 126 and via pillar bond pads 128, stripping the subsequent dielectric layer, and further followed by forming a first metallization layer with openings 132. It may now be understood that the via pillar bond pad 126 and the via pillar bond pad 128 may be formed simultaneously where access to the via pillar 110 is achieved through the metallization layer with openings 132. The metallization layer with openings 132 may also be referred to as a solder-resist layer with openings 132. It can be seen that solder-resist layer with openings 132 exposes the subsequent bond pads 126. It may be understood the "metallization layer with opens 132" may be colloquially used in the industry such as "solder resist opens" (SROs) where the opens function as contact corridors that may facilitate an electrical bump and a bond pad connection.

The first solder-resist layer with openings 132 represents an interface between the organic substrate 20 and any metallization that might be needed for a given specific use of the embedded silicon bridge 10. It may be understood throughout this disclosure that the subsequent bond pad 126 is above and in electrical communication with the first via 124 including as illustrated to be above and in direct electrical contact with the first via 124.

It can now be understood that photolithographic processing embodiments depicted herein allow for small geometries that may be otherwise limited if laser drilling were used to open locations for both the first bond pad 122 and the first via 124. For example, a conventional laser drill may not be able to create a bond-pad open where it is limited to about 25 micrometer (μm) and to obtain a smaller than 25 μm geometry, an ultraviolet (UV) laser may be used, but at the expense of significantly slower throughput.

Attention is directed to items called out in FIG. 1 at the left side including structures touching the item indicated with reference numeral 123. In an embodiment, a substrate-base interconnect includes an integral first bond pad and via 123 that has been plated upon a seed layer 120. In an embodiment, photolithography techniques are used by patterning a first dielectric layer 129, followed by filling a sacrificial dummy (not pictured) that takes up the space equivalent of the first bond pad 122 seen adjacent and to the left of the integral first bond pad and via 123. Thereafter, the first dielectric layer 129 is height reduced such as by wet etching, plasma etching, and RIE to achieve the first dielectric layer 129 as depicted, such that the etch is selective to leaving the pre-existing via pillars 110, and the sacrificial dummy. Next, a second dielectric layer 131 is formed that may also cover the pre-existing via pillars 110, and it is patterned to open the via portion of the integral first bond pad and via 123. After patterning, the dummy layer is dissolved by any known, useful technique such as a wet etch that is selective to leaving the seed layer 120, the first dielectric layer 129 and the patterned second dielectric layer 131. This etching removes the dummy to create a negative space to be filled in by plating the integral first bond pad and via 123. Thereafter, second dielectric layer 131 is height reduced to expose the Z-height of both the top of the integral first bond pad and via 123 and the tops of the pre-existing via pillars 110. It may be observed that the integral first bond pad and via 123 may have a lower electrical resistance than that of the first bond pad 122 and first via 124 because of one less metal-to metal interface within the integral first bond pad and via 123.

Thereafter, the subsequent bond pad 126 is formed by patterning a subsequent dielectric layer (not illustrated), followed by plating the subsequent bond pad 126 and via pillar bond pads 128, stripping the subsequent dielectric layer, and further followed by forming a first solder-resist layer with openings 132. The first solder-resist layer with openings 132 represents an interface between the organic substrate 20 and any metallization that might be needed for a given specific use of the embedded silicon bridge 10.

It may now be observed in an embodiment that the first bond pad 122 and first via 124, depicted left of the arbitrary break 30, usefully will occupy all via structures useful at this level within the organic substrate 20. It may now be observed in an embodiment that the integral bond pad and via 123, depicted left of the arbitrary break 30, will occupy all via structures useful at this level within the organic substrate 20.

Attention is directed in FIG. 1 to the right side, from the arbitrary break 30 that is shown to assist illustrating selected process embodiments.

Attention is directed to items called out in FIG. 1 at the right side including structures touching the item indicated with reference numeral 124. In an embodiment, a substrate-base interconnect includes a seed layer, a first bond pad 122, a first via 124, and a subsequent bond pad 126. The first bond pad 122 has been plated upon the seed layer 120, and the first via 124 has been formed on the first bond pad 122 by a semi-additive plating technique. In an embodiment, photolithography techniques are used to first form the first bond pad 122 by patterning a first dielectric layer 129, followed by plating such as electroplating the first bond pad 122 onto the seed layer 120. In an embodiment, the first dielectric layer (not pictured) is first formed and patterned for the first bond pad 122 but at a Z-height that protects the pre-existing via pillars 110 during plating of the first bond pad 122. Thereafter, the first dielectric layer is stripped and removed such as by wet etching, plasma etching, or reactive-ion etching (RIE), such that the etch is selective to leaving the first bond pad 124 and the pre-existing via pillars 110. Next, semi-additive plating is done by forming and patterning a second dielectric layer 131 that may also cover the pre-existing via pillars 110 during plating of the first via 124, followed by another etch that height-reduces the second dielectric layer 131 to a height that exposes and stops at the Z-height of both the first via 124 and the tops of the pre-existing via pillars 110. Thereafter, the subsequent bond pad 126 is formed by patterning a subsequent dielectric layer (not illustrated), followed by plating the subsequent bond pad 126 and via pillar bond pads 128, stripping the subsequent dielectric layer, and further followed by forming a first solder-resist layer with openings 132. The first solder-resist layer with opens 132 represents an interface between the organic substrate 20 and any metallization that might be needed for a given specific use of the embedded silicon bridge 10.

Attention is directed to items called out in FIG. 1 at the right side including structures touching the item indicated with reference numeral 123. In an embodiment, a substrate-base interconnect includes an integral first bond pad and via 123 that has been plated upon a seed layer 120. In an embodiment, photolithography techniques are used by patterning a first dielectric layer (not pictured), followed by filling a sacrificial dummy (not pictured) that takes up the space equivalent of the first bond pad 122 seen adjacent and to the left of the integral first bond pad and via 123. Thereafter, the first dielectric layer is stripped and removed such as by wet etching, plasma etching, and RIE, such that the etch is selective to leaving the pre-existing, tall via pillars 110, and the sacrificial dummy. Next, a second dielectric layer 131 is formed that may also cover the pre-existing via pillars 110, and it is patterned to open the via portion of the integral first bond pad and via 123. After patterning, the dummy layer is dissolved by any known, useful technique such as a wet etch that is selective to leaving the seed layer 120 and the patterned second dielectric layer 131. This etching removes the dummy to create a negative space to be filled in by plating the integral first bond pad and via 123. Thereafter, second dielectric layer 131 is height reduced to expose the Z-height of both the top of the integral first bond pad and via 123 and the tops of the pre-existing, tall via pillars 110. It may be observed that the integral first bond pad and via 123 may have a lower electrical resistance than that of the first bond pad 122 and first via 124 because of one less metal-to metal interface within the integral first bond pad and via 123.

Thereafter, the subsequent bond pad 126 is formed by patterning a subsequent dielectric layer (not illustrated), followed by plating the subsequent bond pad 126 and via pillar bond pads 128, stripping the subsequent dielectric layer, and further followed by forming a first solder-resist layer with openings 132. The first solder-resist layer with openings 132 represents an interface between the organic substrate 20 and any metallization that might be needed for a given specific use of the embedded silicon bridge 10.

It may now be observed in an embodiment that the first bond pad 122 and first via 124, depicted right of the arbitrary break 30, usefully will occupy all via structures useful at this level within the organic substrate 20. It may now be observed in an embodiment that the integral bond pad and via 123, depicted right of the arbitrary break 30, will occupy all via structures useful at this level within the organic substrate 20.

FIG. 1A includes cross-section and perspective elevations of the embedded-bridge device depicted in FIG. 1 during processing according to an embodiment. The drawing to the left is an X-Z cross-section elevation of some of the left portion of the illustration in FIG. 1, and the drawing to the right is an X-Y-Z perspective elevation of some of the left portion of the illustration in FIG. 1. The cross-section elevation is taken along the line 1-1' from the perspective elevation. Processing conditions are illustrated and described for a two-part, pad-and-via process that results in a first bond pad 122 and a first via 124, and not for the integral first bond pad and via 123 embodiment.

The base layer 112 and the bridge-level organic layer 116 may encompass several layers, represented here as an intermediate layer 113. The first bond pad 122 has been formed upon a seed layer (not pictured) such as the seed layer 120 illustrated in FIG. 1. A first trace 134 is also depicted running along the surface of the bridge-level organic layer 116 and it may be an integral structure with the first bond pad 122 due to simultaneous photolithographic and plating processing conditions.

Figure 1B:
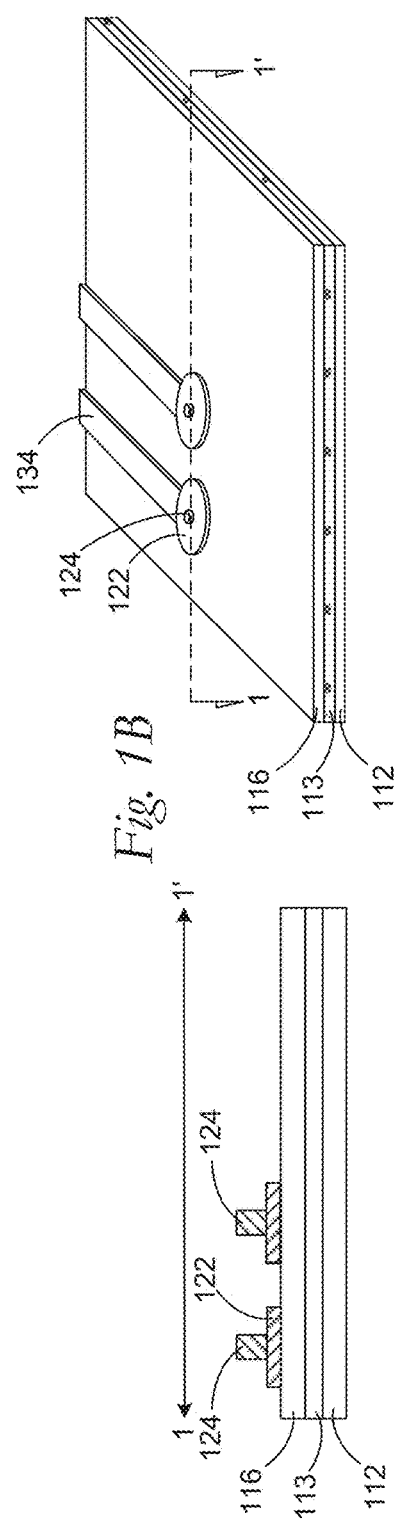
FIG. 1B includes cross-section and perspective elevations of the embedded-bridge device depicted in FIG. 1A after further processing according to an embodiment.

FIG. 1B includes cross-section and perspective elevations of the embedded-bridge device depicted in FIG. 1A after further processing according to an embodiment. The first via 124 has been formed by any of the processes illustrated and described for formation of the first via 124 depicted in FIG. 1.

Figure 1C:
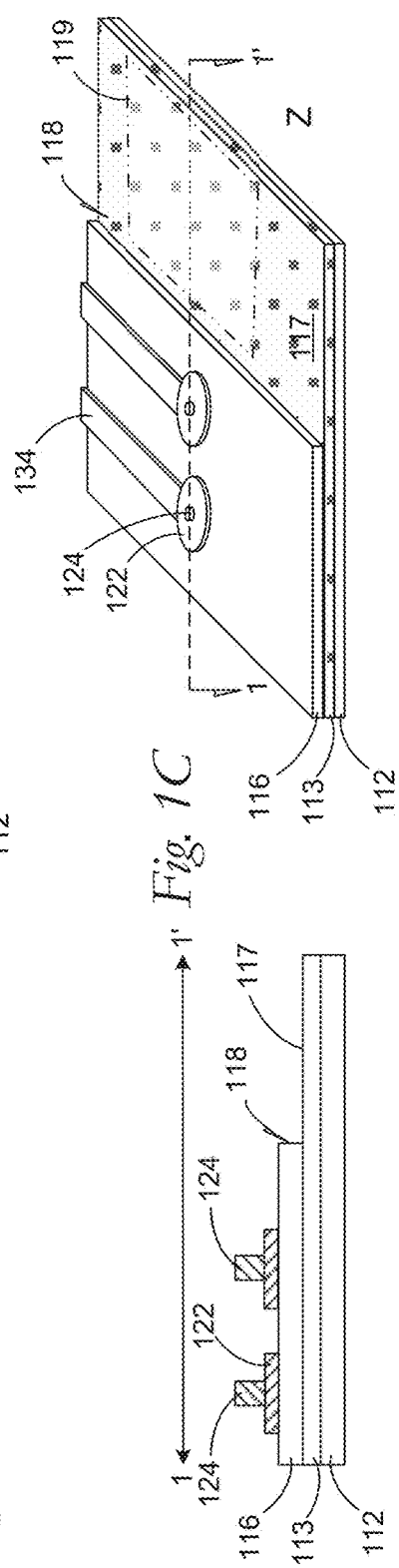
FIG. 1C includes cross-section and perspective elevations of the embedded-bridge device depicted in FIG. 1B after further processing according to an embodiment.

FIG. 1C includes cross-section and perspective elevations of the embedded-bridge device depicted in FIG. 1B after further processing according to an embodiment. The bridge-level organic layer 116 has been milled to create the recess 118 into which the silicon bridge 10 is to be seated. In an embodiment, a seating surface 117 may be milled from the bridge-level organic layer 116 such that the seating surface 117 is a remainder of the bridge-level organic layer 116 as depicted in FIG. 1. In an embodiment, the seating surface 117 is a structure below the bridge-level organic layer 116 such that milling has resulted in removal of all of the bridge-level organic layer 116. Milling of the recess 118 in an embodiment includes laser drilling. Milling of the recess 118 in an embodiment includes mechanical ablation or laser ablation. Milling of the recess 118 in an embodiment includes a photo-defined etch. Milling of the recess 118 in an embodiment includes a photo-defined etch such as reactive ion etching (RIE). Milling of the recess 118 in an embodiment includes etching such as plasma etching.

Adhesion of the silicon bridge into the recess 118 may be assisted by placing a die-attach film 119 such as an adhesive material according to an embodiment. In an embodiment, the die-attach film 119 has a footprint that is smaller than the silicon bridge 10. In an embodiment, the die-attach film 119 has a footprint that is substantially the same as the silicon bridge 10 under ordinary processing parameters. In an embodiment, the die-attach film 119 has a footprint that is larger than the silicon bridge 10. In an embodiment, the die-attach film 119 has a footprint that is narrower than the silicon bridge 10 when viewed along the X-direction, but it is one of substantially the same as or longer than the silicon bridge 10 when viewed along the Y-direction.

In an embodiment, the adhesive material 119 is an anisotropic conductive film. In an embodiment, the adhesive material 119 is an anisotropic conductive film that is fashioned from a conductive paste. In an embodiment, the adhesive material 119 is a conductive film that is achieved with a sinterable conductive paste. In an embodiment, the adhesive material 119 is a metal ink that is printed into a pattern to accept and couple to a through-silicon via (TSV) in the silicon bridge 10.

Figure 8:
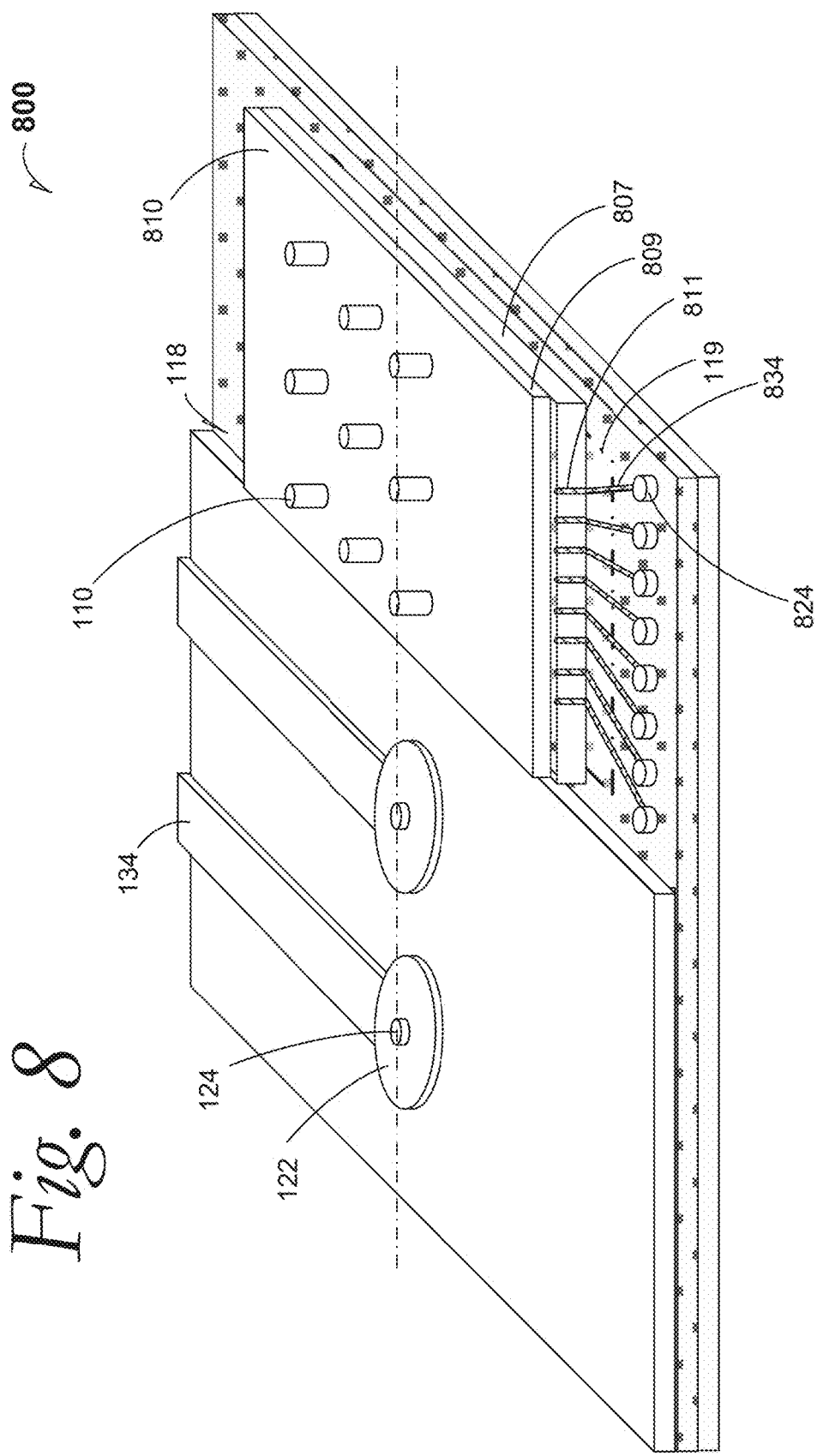
FIG. 8 is a perspective elevation with cut-away and cross-section portions illustrated according to an embodiment.

Attention is directed to FIG. 8.

FIG. 8 is a perspective elevation with cut-away and cross-section portions illustrated according to an embodiment. An adhesive material 119 is depicted in the recess 118 and the silicon bridge 810 is cut away compared to the silicon bridge 10 depicted in FIG. 1C (which is also cut away compared to e.g. FIGS. 1, 2, 3, and 4).

A silicon bridge base 807 is depicted without metallization and active devices, if any, and an active surface 809 is depicted with at least metallization to connect to the pre-existing via pillars 110. A portion of the active surface is cut away to reveal several through-silicon vias (TSVs), one of which is indicated with reference numeral 811. The TSV 811 extends from the active surface of the silicon bridge and in a direction opposite from the via pillar. Thus, the via pillar 110 extends vertically upward in the Z-direction from the active surface 809 and the TSV 811 extends vertically downward in the Z-direction from the active surface 809. Consequently, the via pillar 110 and the TSV 811 extend in opposite directions away from the active surface 809.

It can be seen the TSVs 811 appear in "mouse-bite" form as some of the silicon bridge base 807 is also cut away where it may have occupied the footprint of the adhesive material 119 in the Y-direction. Additionally, the "mouse-bite" displayed TSV 811 is coupled to a fan-out trace 834 in an embodiment. Also in an embodiment, the "mouse-bite" displayed TSV 811 is coupled to an embedded via 824 that is also exposed in the cut-away perspective view.

It may be understood in an embodiment that the active surface 809 is mostly metallization to couple the pre-existing via pillar 110 at the illustrated end of the silicon bridge 810 and in the X-direction, to the non-illustrated portion but as would be seen in any of FIGS. 1-5.

In an embodiment, a TSV 811 is employed to leverage use of both X-Y planar surfaces of the silicon bridge 810 for interconnection and power and ground if needed. In an embodiment, a plurality of pre-existing via pillars 110 is configured to connect to a semiconductive device in a die according to specific design rules dictated by the semiconductive die, and a plurality of TSVs 811 is configured to accommodate a fan-in interconnection design according to an embodiment. With a fan-out embodiment, interconnects in the organic substrate 20 are fanned in to mate with the TSVs 811 according to specific design rules. For example a portion of the adhesive layer 119 is an organic adhesive and another portion is a metal ink that forms a fan-in interconnect pattern that miniaturizes from larger pattern in the organic substrate 20 to a smaller pattern that mates to the TSVs 811.

Attention is directed to FIG. 1D.

FIG. 1D includes cross-section and perspective elevations of the embedded-bridge device depicted in FIG. 1C after further processing according to an embodiment. The silicon bridge 10 had been seated at the level of the recess 118 (see FIG. 1C) that has been formed in the bridge-level organic layer 116. It can be seen that the pre-existing via pillars 110 achieve a height Z above the upper surface of the bridge-level organic layer 116 that matches the height of the top of the first via 124. Consequently, the pre-existing via pillars 110 are sufficiently tall to on the silicon bridge 10, that the design allows for a scalable embedded silicon bridge structure in a lithographically defined via package.

Figure 5:
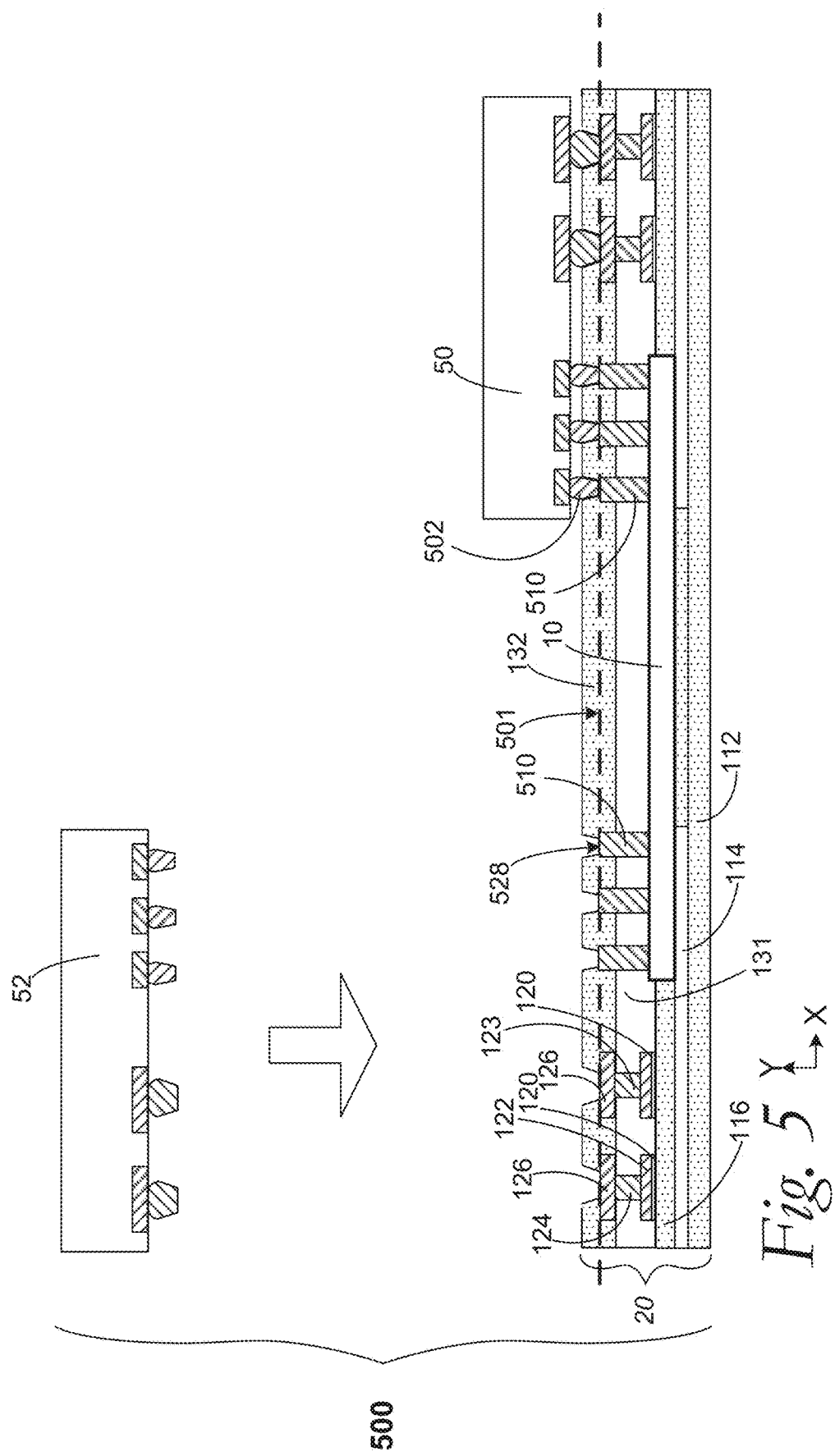
FIG. 5 is a cross-section elevation of an embedded silicon bridge with tall via pillars that match a metallization subsequent pad height according to an embodiment.

Reference is made to FIGS. 4 and 5. It can be seen that the pre-existing, tall via pillars 110 may achieve a Z-height above the upper surface of the bridge-level organic layer 116 that will eventually match the height of the subsequent bond pad 126 depicted in FIGS. 4 and 5. Hereinafter, a "tall via pillar" extends to the same level as a subsequent bond pad 126. Consequently, the pre-existing, tall via pillars 110 are sufficiently tall extending from the silicon bridge 10, that the design allows for a scalable embedded silicon bridge structure in a lithographically defined via package.

FIG. 1E includes cross-section and perspective elevations of the embedded-bridge device depicted in FIG. 1D after further processing according to an embodiment. A second dielectric precursor layer 130 is formed over the first vias 124, the silicon bridge 10, and the pre-existing via pillars 110 such that after height reduction such as etchback, the second dielectric layer 131 depicted in FIG. 1 will be achieved.

FIG. 1F includes cross-section and perspective elevations of the embedded-bridge device depicted in FIG. 1E after further processing according to an embodiment. An etch-back process has been accomplished to height-reduce the second dielectric layer precursor 130 (see FIG. 1E) to achieve the second dielectric layer 131 that exposes the tops of the first vias 124 and the tops of the pre-existing via pillars 110 that extend from the silicon bridge 10.

FIG. 1G includes cross-section and perspective elevations of the embedded-bridge device depicted in FIG. 1F after further processing according to an embodiment. Subsequent bond pads 126 and via pillar bond pads 128 have been formed on the subsequent dielectric layer 131 such as by patterning on the subsequent dielectric layer 131, followed by plating the bond pads 126 and 128.

FIG. 1H includes cross-section and perspective elevations of the embedded-bridge device depicted in FIG. 1G after further processing according to an embodiment. A solder-resist layer with opens 132 has been formed such that the subsequent bond pads 126 (see FIG. 1G) and the pillar bond pads 128 (see FIG. 1G) are exposed through the layer 132.

FIG. 2 is a cross-section elevation of an embedded silicon bridge 200 with ganged pre-existing, via pillars 210 according to an embodiment. The ganged via pillar 210 is seen to be wider in the X-direction than an adjacent via pillar 110. In an embodiment, the ganged via pillar 210 is wider than the adjacent via pillar 110 in the X-direction and the same dimension as the adjacent via pillar 110 in the Y-direction (not illustrated). Hereinafter, it may be understood that a ganged via pillar 210 has at least one dimension X- or Y dimension that is larger than via pillar 110. In an embodiment, the ganged pillar is eccentric shaped with the broadest dimension seen along the X-direction and the narrowest dimension seen along the Y-direction (not illustrated).

An embedded semiconductive bridge 10 (hereinafter. "silicon bridge") is disposed within an organic substrate 20. The silicon bridge 10 has been seated with pre-existing via pillars 110 during fabrication of the organic substrate 20. Illustrated in FIG. 2 are two pre-existing via pillars 110 and two ganged pre-existing via pillars 210, grouped at the margins of the silicon bridge 10 as illustrated in this cross-section along the X-direction. In an embodiment, the pre-existing via pillars 110 have a Y-X aspect ratio greater than 1:1 and the ganged pre-existing via pillars 210 have a height that is similar to the pre-existing via pillars under processing-parameter limitations. In an embodiment, the pre-existing via pillars 110 have a Y-X aspect ratio less than 1:1 and the ganged pre-existing via pillars 210 have a similar height. In an embodiment, the preexisting via pillars 110 have a Y-X aspect ratio less than or equal to 10:1 and the ganged pre-existing via pillars 210 have a similar height. In an embodiment, the pre-existing via pillars 110 have a Y-X aspect ratio in a range from 9:1 to 2:1 and the ganged pre-existing via pillars 210 have a similar height. In an embodiment, the pre-existing via pillars 110 have a Y-X aspect ratio in a range from 8:1 to 3:1 and the ganged pre-existing via pillars 210 have a similar height. In an embodiment, the pre-existing via pillars 110 have a Y-X aspect ratio in a range from 7:1 to 4:1 and the ganged pre-existing, tall via pillars 210 have a similar height. In an embodiment, the pre-existing, tall via pillars 110 have a Y-X aspect ratio in a range from 6:1 to 5:1 and the ganged pre-existing, tall via pillars 210 have a similar height.

The organic substrate 20 may have a base layer 112 and a first trace layer 114. In an embodiment, a bridge-level organic layer 116 has been milled to create a recess into which the silicon bridge 10 has been seated.

Attention is directed in FIG. 2 to the left side, from the arbitrary break 30 that is shown to assist illustrating selected process embodiments.

Attention is directed to items called out in FIG. 2 at the left side including structures touching the item indicated with reference numeral 124. In an embodiment, a substrate-base interconnect includes a seed layer 120, a first bond pad 122, a first via 124, and a subsequent bond pad 126. The first bond pad 122 has been plated upon the seed layer 120, and the first via 124 that has been formed on the first bond pad 122 by a semi-additive plating technique. In an embodiment, photolithography techniques are used to first form the first bond pad 122 by patterning a first dielectric layer 129, followed by plating such as electroplating the first bond pad 122 onto the seed layer 120. In an embodiment, the first dielectric layer 129 is first formed and patterned for the first bond pad 122 but at a Z-height that protects the pre-existing, tall via pillars 110 and 210 during plating of the first bond pad 122. Thereafter, the first dielectric layer 129 is height reduced such as by wet etching, plasma etching, and reactive-ion etching (RIE) to achieve the first dielectric layer 129 as depicted, such that the etch is selective to leaving the first bond pad 124 and the pre-existing via pillars 110 and 210. Next, semi-additive plating is done by forming and patterning a second dielectric layer 131 that may also cover the pre-existing via pillars 110 and 210 during plating of the first via 124, followed by another etch that height-reduces the second dielectric layer 131 that exposes and stops at the Z-height of both the first via 124 and the tops of the pre-existing via pillars 110. Thereafter, the subsequent bond pad 126 is formed by patterning a subsequent dielectric layer (not illustrated), followed by plating the subsequent bond pad 126 and pre-existing via pillar bond pads 128 and 128', stripping the subsequent dielectric layer, and further followed by forming a first solder-resist layer with opens 132. The first solder-resist layer with opens 132 exposes the subsequent bond pad 126 as well as the pillar bond pads 128 and 128' and it represents an interface between the organic substrate 20 and any metallization that might be needed for a given specific use of the embedded silicon bridge 10.

It can now be understood that photolithographic processing embodiments depicted herein allow for small geometries that may be otherwise limited if laser drilling were used to open locations for both the first bond pad 122 and the first via 124. For example, a conventional laser drill may not be able to create a bond-pad open where it is limited to about 25 micrometer (µm) and to obtain a smaller than 25 µm geometry, an ultraviolet (UV) laser may be used, but to the expense of significantly slower throughput.

Attention is directed to items called out in FIG. 2 at the left side including structures touching the item indicated with reference numeral 123. In an embodiment, a substrate-base interconnect includes an integral first bond pad and via 123 that has been plated upon a seed layer 120. In an embodiment, photolithography techniques are used by patterning a first dielectric layer 129, followed by filling a sacrificial dummy (not pictured) that takes up the space equivalent of the first bond pad 122 seen adjacent and to the left of the integral first bond pad and via 123. Thereafter, the first dielectric layer 129 is height reduced such as by wet etching, plasma etching, and RIE to achieve the first dielectric layer 129 as depicted, such that the etch is selective to leaving the pre-existing via pillars 110 and 210, and the sacrificial dummy. Next, a second dielectric layer 131 is formed that may also cover the pre-existing via pillars 110 and 210, and it is patterned to open the via portion of the integral first bond pad and via 123. After patterning, the dummy layer is dissolved by any known, useful technique such as a wet etch that is selective to the seed layer 120, the first dielectric layer 129 and the patterned second dielectric layer 129. This etching removes the dummy to create a negative space to be filled in by plating the integral first bond pad and via 123. Thereafter, second dielectric layer 131 is height reduced to expose the Z-height of both the top of the integral first bond pad and via 123 and the tops of the pre-existing via pillars 110 and 210. It may be observed that the integral first bond pad and via 123 may have a lower electrical resistance than that of the first bond pad 122 and first via 124 because of one less metal-to metal interface within the integral first bond pad and via 123.

Thereafter, the subsequent bond pad 126 is formed by patterning a subsequent dielectric layer (not illustrated), followed by plating the subsequent bond pad 126 and via pillar bond pads 128 and 128', stripping the subsequent dielectric layer, and further followed by forming a first solder-resist layer with openings 132. The via pillar bond pads 128' contact a ganged via pillar 210 and the via pillar bond pads 128 contact a non-ganged via pillar 110. The first solder-resist layer with openings 132 exposes the subsequent bond pad 126 as well as the via bond pads 128 and 128', and it represents an interface between the organic substrate 20 and any metallization that might be needed for a given specific use of the embedded silicon bridge 10.

It may now be observed in an embodiment that the first bond pad 122 and first via 124, depicted left of the arbitrary break 30, usefully will occupy all via structures useful at this level within the organic substrate 20. It may now be observed in an embodiment that the integral bond pad and via 123, depicted left of the arbitrary break 30, will occupy all via structures useful at this level within the organic substrate 20.

Attention is directed in FIG. 2 to the right side, from the arbitrary break 30 that is shown to assist illustrating selected process embodiments.

Attention is directed to items called out in FIG. 2 at the right side including structures touching the item indicated with reference numeral 124. In an embodiment, a substrate-base interconnect includes a seed layer, a first bond pad 122, a first via 124, and a subsequent bond pad 126. The first bond pad 122 has been plated upon the seed layer 120, and the first via 124 that has been formed on the first bond pad 122 by a semi-additive plating technique. In an embodiment, photolithography techniques are used to first form the first bond pad 122 by patterning a first dielectric layer (not pictured), followed by plating such as electroplating the first bond pad 122 onto the seed layer 120. In an embodiment, the first dielectric layer is first formed and patterned for the first bond pad 122 but at a Z-height that protects the pre-existing via pillars 110 and 210 during plating of the first bond pad 122. Thereafter, the first dielectric layer is stripped and removed such as by wet etching, plasma etching, and reactive-ion etching (RIE) to achieve the first dielectric layer 129 as depicted, such that the etch is selective to leaving the first bond pad 124 and the pre-existing via pillars 110 and 210. Next, semi-additive plating is done by forming and patterning a second dielectric layer 131 that may also cover the pre-existing via pillars 110 and 210 during plating of the first via 124, followed by another etch that height-reduces the second dielectric layer 131 to a height that exposes and stops at the Z-height of both the first via 124 and the tops of the pre-existing via pillars 110 and 210. Thereafter, the subsequent bond pad 126 is formed by patterning a subsequent dielectric layer (not illustrated), followed by plating the subsequent bond pad 126 and via pillar bond pads 128 and 128', stripping the subsequent dielectric layer, and further followed by forming a first solder-resist layer with openings 132. The first solder-resist layer with openings 132 represents an interface between the organic substrate 20 and any metallization that might be needed for a given specific use of the embedded silicon bridge 10.

Attention is directed to items called out in FIG. 2 at the right side including structures touching the item indicated with reference numeral 123. In an embodiment, a substrate-base interconnect includes an integral first bond pad and via 123 that has been plated upon a seed layer 120. In an embodiment, photolithography techniques are used by patterning a first dielectric layer (not pictured), followed by filling a sacrificial dummy (not pictured) that takes up the space equivalent of the first bond pad 122 seen adjacent and to the left of the integral first bond pad and via 123. Thereafter, the first dielectric layer is stripped and removed such as by wet etching, plasma etching, and RIE, such that the etch is selective to leaving the pre-existing via pillars 110 and 210, and the sacrificial dummy. Next, a second dielectric layer 131 is formed that may also cover the pre-existing via pillars 110 and 210, and it is patterned to open the via portion of the integral first bond pad and via 123. After patterning, the dummy layer is dissolved by any known, useful technique such as a wet etch that is selective to the seed layer 120 and the patterned second dielectric layer 131. This etching removes the dummy to create a negative space to be filled in by plating the integral first bond pad and via 123. Thereafter, second dielectric layer 131 is height reduced to expose the Z-height of both the top of the integral first bond pad and via 123 and the tops of the via pillars 110 and 210. It may be observed that the integral first bond pad and via 123 may have a lower electrical resistance than that of the first bond pad 122 and first via 124 because of one less metal-to metal interface within the integral first bond pad and via 123.

Thereafter, the subsequent bond pad 126 is formed by patterning a subsequent dielectric layer (not illustrated), followed by plating the subsequent bond pad 126 and via pillar bond pads 128 and 128', stripping the subsequent dielectric layer, and further followed by forming a first solder-resist layer with openings 132. The first solder-resist layer with openings 132 represents an interface between the organic substrate 20 and any metallization that might be needed for a given specific use of the embedded silicon bridge 10.

It may now be observed in an embodiment that the first bond pad 122 and first via 124, depicted right of the arbitrary break 30, usefully will occupy all via structures useful at this level within the organic substrate 20. It may now be observed in an embodiment that the integral bond pad and via 123, depicted right of the arbitrary break 30, will occupy all via structures useful at this level within the organic substrate 20.

FIG. 3 is a cross-section elevation of an embedded silicon bridge 300 with bond-pad-on-bridge reinforced via pillars according to an embodiment. For simplicity, similar structures are seen in FIG. 1 to the right of the arbitrary break 30 with respect to processing of the first via 124 and where the second dielectric layer 131 has been formed after stripping away any previous dielectric layers that may have affected the silicon bridge 10. It may be understood, however, that integral first bond-pad-and-via structures may accompany the reinforced, pre-existing via pillars 311 during fabrication of the embedded silicon bridge 300.

A reinforcement via pillar pad 311 accompanies the pre-existing via pillars 310. During processing when the silicon bridge 10 is seated in e.g. the recess 118 as seen in FIGS. 1C and 1D, the reinforcement via pillar pad 311 and the pre-existing via pillars 310 have been previously assembled to the silicon bridge 10 before seating.

It can be seen that the pre-existing via pillars 110 achieve a height Z above the upper surface of the bridge-level organic layer 116 that will eventually match the height at the bottom of the subsequent bond pad 126. Consequently, the pre-existing via pillars 110 are sufficiently tall to on the silicon bridge 10, that the design allows for a scalable embedded silicon bridge structure in a lithographically defined via package.

FIG. 4 is a cross-section elevation of an embedded silicon bridge 400 with bond-pad-on-bridge reinforced, tall via pillars that match a metallization subsequent pad height 401 according to an embodiment. Again, a "tall via pillar" extends to the same level as a subsequent bond pad 126. Consequently, the pre-existing, tall via pillars 410 are sufficiently tall extending from the silicon bridge 10, that the design allows for a scalable embedded silicon bridge structure in a lithographically defined via package.

For simplicity, similar structures are seen in FIG. 3 with respect to processing of the first via 124 and where the second dielectric layer 131 has been formed after stripping away any previous dielectric layers that may have affected the silicon bridge 10. It may be understood, however, that integral first bond-pad-and-via structures may accompany the reinforced, pre-existing, tall via pillars 410 during fabrication of the embedded silicon bridge 400.

A reinforcement tall-via pillar pad 411 accompanies the pre-existing, tall via pillars 410. During processing when the silicon bridge 10 is seated in e.g. the recess 118 as seen in FIGS. 1C and 1D, the reinforcement tall-via pillar pad 411 and the pre-existing, tall via pillars 410 have been previously assembled to the silicon bridge 10 before seating.

It can be seen that the pre-existing tall via pillars 410 achieve a Z-height substantially as the top surface of the metallization subsequent pad height 401. Consequently, the pre-existing, tall via pillars 410 are sufficiently tall on the silicon bridge 10, that the design allows for a scalable embedded silicon bridge structure in a lithographically defined via package.

It may now be understood that the bond-pad-on-bridge pre-existing, tall via pillars 410 when reaching the same height as the subsequent pad height 401, may be sufficiently tall such that the first via 124 may be followed by a second bond pad and a subsequent via, followed by the subsequent bond pad 126. This means the bond-pad-on-bridge pre-existing, tall via pillar 410 may reach a height involving the equivalent of a plurality of vias that are seriatim stacked above the first bond pad 122.

FIG. 5 is a cross-section elevation of an embedded silicon bridge 500 with tall via pillars 510 that match a metallization subsequent pad height 501 according to an embodiment.

For simplicity, similar structures are seen in FIG. 4, with respect to processing of the first via 124 and where the second dielectric layer 131 has been formed after stripping away any previous dielectric layers that may have affected the silicon bridge 10. It may be understood, however, that integral first bond-pad-and-via structures may accompany the reinforced, pre-existing, tall via pillars 510 during fabrication of the embedded silicon bridge 400.

During processing when the silicon bridge 10 is seated in e.g. the recess 118 as seen in FIGS. 1C and 1D, the pre-existing, tall via pillars 510 have been previously assembled to the silicon bridge 10 before seating.

It can be seen that the pre-existing tall via pillars 510 achieve a Z-height substantially as the top surface of the metallization subsequent pad height 501. Consequently, the pre-existing, tall via pillars 510 are sufficiently tall on the silicon bridge 10, that the design allows for a scalable embedded silicon bridge structure in a lithographically defined via package.

It may now be understood that the pre-existing, tall via pillar 510 when reaching the same height as the subsequent pad height 501, may be sufficiently tall such that the first via 124 may be followed by a second bond pad and a subsequent via, followed by the subsequent bond pad 126. This means the pre-existing, tall via pillar 510 may reach a height involving the equivalent of a plurality of vias that are seriatim stacked above the first bond pad 122.

FIG. 5 also illustrates a semiconductor device in a die 50 that is attached to an electrical bump 502 that occurs in the solder-resist layer with openings 132 at the metallization subsequent pad height 501. It may now be understood that the silicon bridge 10 is configured to provide communication between the first semiconductor device in a die 50 (illustrated at the right) and a subsequent semiconductor device in a die 52 (illustrated by down-arrow movement during mating) that is mounted at the left of the FIG. 5 where the top of the pre-existing tall via pillar 528 is exposed through the solder-resist layer with openings 132.

It may now be understood that all illustrated embodiments including but not limited to FIGS. 1-5, 1A-1H, and 6-8 may include at least one semiconductor device in a die 50. Also in an embodiment, all illustrated embodiments may also include the semiconductor device in a die 50 as a first semiconductor device in a die 50 and a semiconductor device in a die 52 such as the second semiconductor device in a die 52.

Figure 6:
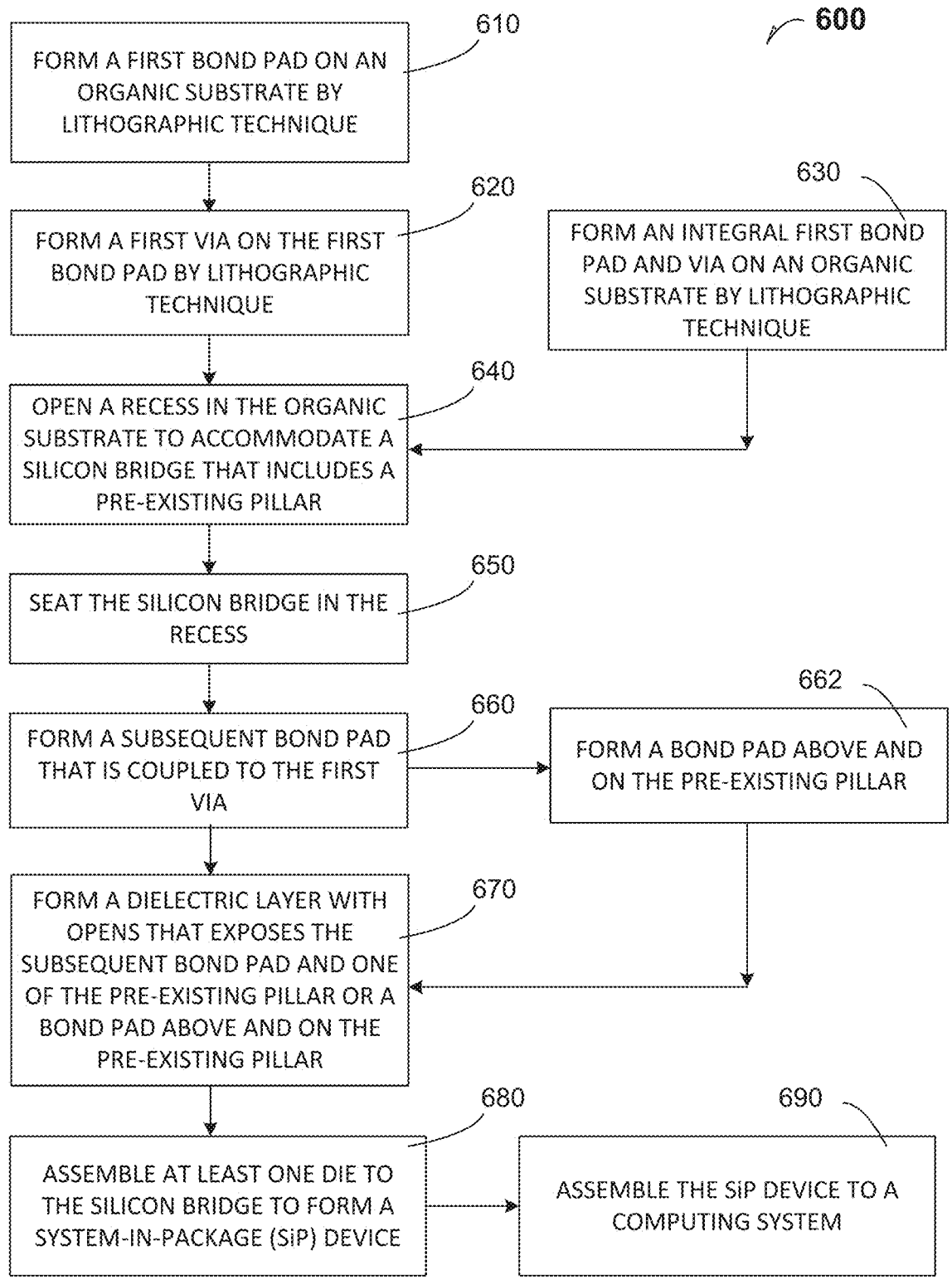
FIG. 6 is a process flow diagram that illustrates processing according to an embodiment.

FIG. 6 is a process flow diagram 600 that illustrates processing according to an embodiment.

At 610, the process includes forming a first bond pad on an organic substrate by lithographic technique. In a non-limiting example embodiment, the first bond pad 122 as well as the trace 134 are formed on the bridge-level organic layer 116 as depicted in FIG. 1A.

At 620, the process includes forming a first via on the first bond pad by lithographic technique. In a non-limiting example, the first via 124 is formed on the first bond pad 122 such as depicted in FIG. 1B.

At 630, the process alternatively commences with forming an integral first bond-pad and via on an organic substrate by photolithographic technique. In a non-limiting example embodiment, the integral bond pad and via 123 depicted in FIG. 1 is formed as described.

At 640, the process includes opening a recess in the organic substrate to accommodate a silicon bridge that includes a pre-existing via pillar. Milling techniques may be used to form the recess as disclosed. In a non-limiting example embodiment, an adhesive film may be formed in the recess such as the adhesive film 119 depicted in FIG. 1C. In a non-limiting example embodiment, at the level of an adhesive film, if any, a metal ink is patterned to mate with a TSV such as the TSV 811 depicted in FIG. 8.

At 650, the process includes seating the silicon bridge in the recess. In a non-limiting example embodiment, the silicon bridge 10 has been seated in the recess as depicted in FIG. 1D.

At 660, the process includes forming a subsequent bond pad that is coupled to the first via. In a non-limiting example embodiment, the subsequent bond pad 126 is formed on the top of the first via 124 as illustrated in FIG. 1.

At 662, the process includes forming a bond pad above and on the pre-existing via pillar. In a non-limiting example embodiment, a pre-existing-via pillar bond pad 128 is formed at the same level as the subsequent bond pad 126.

At 670, the process includes forming a dielectric layer with opens that exposes the subsequent bond pad and at least one of the pre-existing via pillar or a bond pad above and on the pre-existing via pillar.

At 680, the process includes assembling at least one die to the silicon bridge to form a system-in-package (SiP) device. As illustrated in FIG. 5 in simplified form, a semiconductive device in a die 50 has been assembled to the silicon bridge 10 through bumps that have filled some of the opens in the solder-resist layer with openings 132. It may now be understood that another semiconductive device in a die may be attached opposite the illustrated semiconductive device in a die 50.

At 690, the process includes assembling the SiP to a computing system.

Figure 7:
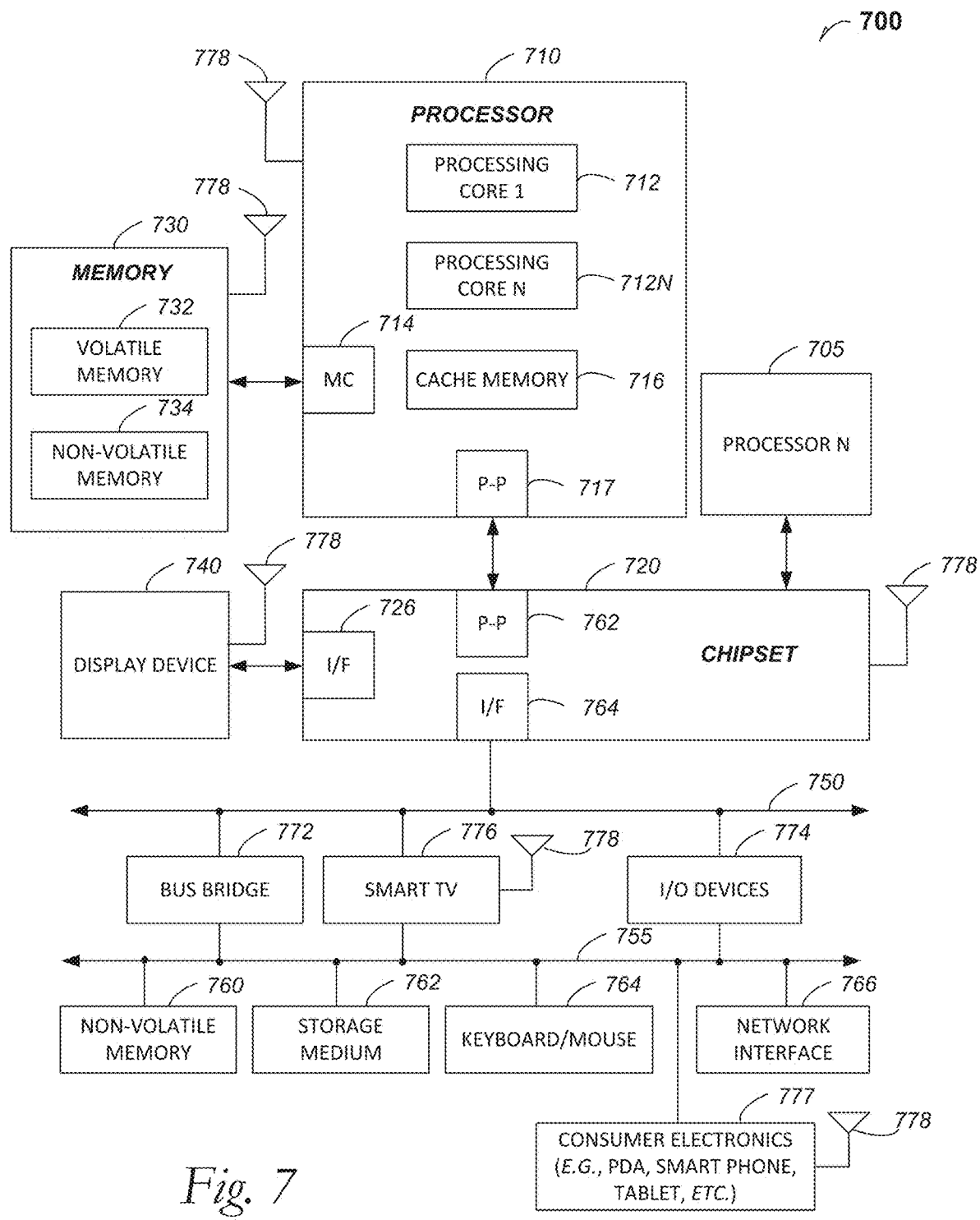
FIG. 7 is a computing system according to an embodiment.

FIG. 7 is a computing system 700 according to an embodiment.

Further discussion of computing system 700 embodiments are set forth herein.

FIG. 7 is a computing system 700 according to an embodiment. FIG. 7 illustrates a system level diagram, according to one embodiment of the invention. For instance, FIG. 7 depicts an example of a microelectronic device that includes an embedded silicon bridge with pre-existing via pillars embodiment as described in the present disclosure.

FIG. 7 is included to show an example of a higher level device application for the embedded silicon bridge with pre-existing via pillars embodiments. In one embodiment, a system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the embedded silicon bridge with pre-existing via pillars embodiment is part of a computing system 700.

In an embodiment, the processor 710 has one or more processing cores 712 and 712N, where 712N represents the Nth processor core inside processor 710 where N is a positive integer. In an embodiment, the electronic device system 700 using a wire-bonded SiP embodiment includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the embedded silicon bridge with pre-existing via pillars embodiment computing system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to an antenna 778 to communicate wirelessly with any device configured to at least one of transmit and receive wireless signals. In an embodiment, the antenna interface 778 operates in accordance with, but is not limited to, the IEEE 802.11 standard and its related family, Home Plug AV (HPAV), Ultra Wide Band (UWB), Bluetooth, WiMax. or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using an embedded silicon bridge with pre-existing via pillars embodiment as set forth in this disclosure. The chipset 720 enables the processor 710 to connect to other elements in the wire-bonded SiP embodiment system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to an antenna to communicate wirelessly 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a single SOC such as selected stair-stacked memory module SiP embodiments described herein. Additionally, the chipset 720 connects to one or more buses 750 and 755 that interconnect various elements 774, 760, 762, 764, and 766. Buses 750 and 755 may be interconnected together via a bus bridge 772. In an embodiment, the chipset 720 couples with a non-volatile memory 760, a mass storage device(s) 662, a keyboard/mouse 664, and a network interface 766 by way of at least one of the interface 724 and 704, the smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax. or any form of wireless communication protocol.

While the modules shown in FIG. 7 are depicted as separate blocks within the embedded silicon bridge with pre-existing via pillars computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

In an embodiment, the computing system 700 is contained in an outer shell that houses any embedded silicon bridge with pre-existing via pillars embodiment. In an embodiment, the base layer 112 is sufficiently constructed to be an insulated outer shell of a computing device. In an embodiment the outer shell is part of a board.

To illustrate the system-in-package apparatus with a package bottom interposer embodiment and methods disclosed herein, a non-limiting list of examples is provided herein:

Example 1 is a semiconductive device in a package comprising: an organic substrate, wherein the organic substrate includes a first bond pad, a first via above and on the first bond pad, wherein the first via extends orthogonally from the first bond pad, and a subsequent bond pad above and in electrical connection with the first via; a solder-resist layer with openings, wherein one open exposes the subsequent bond pad; and a semiconductive bridge embedded in the organic substrate, wherein the semiconductive bridge includes a via pillar that extends vertically from the silicon bridge in the same vertical direction as the first via, and wherein the via pillar extends vertically at least as far as the first via.

In Example 2, the subject matter of Example 1 optionally includes a via pillar bond pad disposed on the via pillar.

In Example 3, the subject matter of any one or more of Examples 1-2 optionally include a via pillar bond pad disposed on the via pillar, wherein the metallization dielectric with openings also exposes the via pillar bond pad.

In Example 4, the subject matter of any one or more of Examples 1-3 optionally include a via pillar bond pad disposed on the via pillar, wherein the via pillar bond pad and the subsequent bond pad are each disposed on a second dielectric layer, and wherein the second dielectric layer is in contact with the solder-resist layer with openings.

In Example 5, the subject matter of any one or more of Examples 1-4 optionally include wherein the via pillar is a ganged via pillar that contacts at least two via pillar bond pads, further including a second via pillar that extends vertically from the silicon bridge and that contacts a single via pillar bond pad.

In Example 6, the subject matter of any one or more of Examples 1-5 optionally include the via pillar is a ganged via pillar that contacts at least two via pillar bond pads, further including a second via pillar that extends vertically from the silicon bridge and that contacts a single via pillar bond pad.

In Example 7, the subject matter of any one or more of Examples 1-6 optionally include wherein the via pillar is seated upon a reinforcement via pillar pad that is affixed to the silicon bridge.

In Example 8, the subject matter of Example 7 optionally includes a via pillar bond pad disposed on the via pillar.

In Example 9, the subject matter of any one or more of Examples 7-8 optionally include a via pillar bond pad disposed on the via pillar, wherein the via pillar bond pad and the subsequent bond pad are each disposed on a second dielectric layer, and wherein the second dielectric layer is in contact with the solder-resist layer with openings.

In Example 10, the subject matter of any one or more of Examples 7-9 optionally include wherein the via pillar is a ganged via pillar that contacts at least two via pillar bond pads, further including a second via pillar that extends vertically from the silicon bridge and that contacts a single via pillar bond pad.

In Example 11, the subject matter of any one or more of Examples 7-10 optionally include the via pillar extends to a height that equals the subsequent bond pad, and wherein each of the subsequent bond pad and the via pillar are exposed through respective opens in the solder-resist layer with openings.

In Example 12, the subject matter of any one or more of Examples 1-11 optionally include a semiconductive device in a die, wherein the semiconductive device in a die is attached to the organic substrate and wherein the semiconductive device in a die is electrically connected to at least the via pillar through the solder-resist layer with openings.

In Example 13, the subject matter of any one or more of Examples 1-12 optionally include a first semiconductive device in a die, wherein the first semiconductive device in a die is attached to the organic substrate and wherein the first semiconductive device in a die is electrically connected to at least the via pillar through the solder-resist layer with openings; and a subsequent semiconductive device in a die, wherein the subsequent semiconductive device in a die is attached to the organic substrate opposite the first semiconductive device in a die, and wherein the subsequent semiconductive device in a die is electrically connected to at least the via pillar through the solder-resist layer with openings 132.

In Example 14, the subject matter of any one or more of Examples 1-13 optionally include wherein the silicon bridge includes an active surface from which the via pillar extends, further including a through-silicon via (TSV) in the silicon bridge, wherein the TSV extends from the active surface and in a direction opposite from the via pillar.

Example 15 is a method of embedding a silicon bridge, comprising: forming a first bond pad on an organic substrate by patterning a mask and plating the first bond pad onto a seed layer; forming a first via on the first bond pad by patterning a mask and plating the first via on the first bond pad; opening a recess in the organic substrate to accommodate a silicon bridge, wherein the silicon bridge includes a pre-existing via pillar disposed thereon; seating the silicon bridge in the recess; forming a subsequent bond pad above the first via; and forming a dielectric layer with opens under conditions to expose the subsequent bond pad and to expose access to the pre-existing via pillar.

In Example 16, the subject matter of Example 15 optionally includes wherein forming the first bond pad and first via includes forming an integral first bond pad and via by plating onto the seed layer.

In Example 17, the subject matter of any one or more of Examples 15-16 optionally include forming a via pillar bond pad simultaneously when forming the subsequent bond pad.

In Example 18, the subject matter of any one or more of Examples 15-17 optionally include wherein the pre-existing via pillar is one of a plurality of via pillars including at least one ganged via pillar, further including forming a plurality of bond pads on the ganged via pillar simultaneously with forming the subsequent bond pad.

In Example 19, the subject matter of any one or more of Examples 15-18 optionally include assembling at least one semiconductor device in a die to the organic substrate in communication with the silicon bridge.

Example 20 is a computing system comprising: an organic substrate, wherein the organic substrate includes a first bond pad, a first via above and on the first bond pad, wherein the first via extends orthogonally from the first bond pad, and a subsequent bond pad above- and in electrical communication with the first via; a solder-resist layer with openings, wherein one open exposes the subsequent bond pad; a semiconductive bridge embedded in the organic substrate, wherein the semiconductive bridge includes a via pillar that extends vertically from the silicon bridge in the same vertical direction as the first via, and wherein the via pillar extends vertically at least as far as the first via; an outer shell that houses the silicon bridge; a first semiconductive device in a die, wherein the first semiconductive device in a die is attached to the organic substrate and wherein the first semiconductive device in a die is electrically connected to at least the via pillar through the solder-resist layer with openings 132; and a subsequent semiconductive device in a die, wherein the subsequent semiconductive device in a die is attached to the organic substrate opposite the first semiconductive device in a die, and wherein the subsequent semiconductive device in a die is electrically connected to at least the via pillar through the solder-resist layer with openings 132.

In Example 21, the subject matter of Example 20 optionally includes a via pillar bond pad disposed on the via pillar, wherein the solder-resist layer with openings also exposes the via pillar bond pad.

In Example 22, the subject matter of any one or more of Examples 20-21 optionally include a via pillar bond pad disposed on the via pillar, wherein the via pillar bond pad and the subsequent bond pad are each disposed on a second dielectric layer, and wherein the second dielectric layer is in contact with the solder-resist layer with openings.

In Example 23, the subject matter of any one or more of Examples 20-22 optionally include wherein the via pillar is a ganged via pillar that contacts at least two via pillar bond pads, further including a second via pillar that extends vertically from the silicon bridge and that contacts a single via pillar bond pad.

In Example 24, the subject matter of any one or more of Examples 20-23 optionally include wherein the via pillar is one of a plurality of via pillars including at least one ganged via pillar, further including forming a plurality of bond pads on the ganged via pillar simultaneously with forming the subsequent bond pad.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductive device in a package comprising:
    an organic substrate, wherein the organic substrate includes a seed layer, a first bond pad, above and on the seed layer, a first via above and on the first bond pad, wherein the first via extends orthogonally from the first bond pad, and a subsequent bond pad above and in electrical connection with the first via, wherein the first bond pad has a bottom surface and a top surface;
    a solder-resist layer with openings, wherein one opening exposes the subsequent bond pad; and
    a semiconductive bridge embedded in the organic substrate, wherein the semiconductive bridge includes a via pillar that extends vertically from the semiconductive bridge in the same vertical direction as the first via, wherein the via pillar extends vertically above the first via, and wherein the via pillar has a same width at a top of the via pillar and at a bottom of the via pillar, wherein the semiconductive bridge comprises a silicon substrate and metallization, and wherein the semiconductive bridge has a bottom surface below the bottom surface of the first bond pad, and the semiconductive bridge has a top surface below the top surface of the first bond pad.

2. The semiconductive device of claim 1, further including a via pillar bond pad disposed on the via pillar.

3. The semiconductive device of claim 1, further including a via pillar bond pad disposed on the via pillar, wherein the solder-resist layer with openings also exposes the via pillar bond pad.

4. The semiconductive device of claim 1, further including a via pillar bond pad disposed on the via pillar, wherein the via pillar bond pad and the subsequent bond pad are each disposed on a second dielectric layer, and wherein the second dielectric layer is in contact with the solder-resist layer with openings.

5. The semiconductive device of claim 1, wherein the via pillar is a ganged via pillar that contacts at least two via pillar bond pads, further including a second via pillar that extends vertically from the semiconductive bridge and that contacts a single via pillar bond pad.

6. The semiconductive device of claim 1, wherein the via pillar extends to a height that equals a top of the subsequent bond pad, and wherein each of the subsequent bond pad and the via pillar are exposed through respective opens in the solder-resist layer with openings.

7. The semiconductive device of claim 1, wherein the via pillar is seated upon a reinforcement via pillar pad that is affixed to the semiconductive bridge.

8. The semiconductive device of claim 7, further including a via pillar bond pad disposed on the via pillar.

9. The semiconductive device of claim 7, further including a via pillar bond pad disposed on the via pillar, wherein the via pillar bond pad and the subsequent bond pad are each disposed on a second dielectric layer, and wherein the second dielectric layer is in contact with the solder-resist layer with openings.

10. The semiconductive device of claim 7, wherein the via pillar is a ganged via pillar that contacts at least two via pillar bond pads, further including a second via pillar that extends vertically from the semiconductive bridge and that contacts a single via pillar bond pad.

11. The semiconductive device of claim 7, wherein the via pillar extends to a height that equals a top of the subsequent bond pad, and wherein each of the subsequent bond pad and the via pillar are exposed through respective opens in the solder-resist layer with openings.

12. The semiconductive device of claim 1, further including a semiconductive device in a die, wherein the semiconductive device in a die is attached to the organic substrate and wherein the semiconductive device in a die is electrically connected to at least the via pillar through the solder-resist layer with openings.

13. The semiconductive device of claim 1, further including:
    a first semiconductive device in a die, wherein the first semiconductive device in a die is attached to the organic substrate and wherein the first semiconductive device in a die is electrically connected to at least the via pillar through the solder-resist layer with openings; and
    a subsequent semiconductive device in a die, wherein the subsequent semiconductive device in a die is attached to the organic substrate opposite the first semiconductive device in a die, and wherein the subsequent semiconductive device in a die is electrically connected to at least the via pillar through the solder-resist layer with openings.

14. The semiconductive device of claim 1, wherein the semiconductive bridge includes an active surface from which the via pillar extends, further including a through-silicon via (TSV) in the semiconductive bridge, wherein the TSV extends from the active surface and in a direction opposite from the via pillar.

15. The semiconductive device of claim 1, further including:
a first semiconductive device in a die, wherein the first semiconductive device in a die is attached to the organic substrate and wherein the first semiconductive device in a die is electrically connected to at least the via pillar through the solder-resist layer with openings; and a subsequent semiconductive device in a die, wherein the subsequent semiconductive device in a die is attached to the organic substrate opposite the first semiconductive device in a die, and wherein the subsequent semiconductive device in a die is electrically connected to at least the via pillar through the solder-resist layer with openings.

16. A semiconductive device in a package comprising:
an organic substrate, wherein the organic substrate includes a seed layer, a first bond pad above and on the seed layer, a first via above and on the first bond pad, wherein the first via extends orthogonally from the first bond pad, and a subsequent bond pad above and in electrical connection with the first via, wherein the first bond pad has a bottom surface and a top surface;
a solder-resist layer with openings, wherein one opening exposes the subsequent bond pad;
a semiconductive bridge embedded in the organic substrate, wherein the semiconductive bridge includes a via pillar that extends vertically from the semiconductive bridge in the same vertical direction as the first via, and wherein the via pillar extends vertically above the first via, and wherein the via pillar has a same width at a top of the via pillar and at a bottom of the via pillar, wherein the semiconductive bridge comprises a silicon substrate and metallization, and wherein the semiconductive bridge has a bottom surface below the bottom surface of the first bond pad, and the semiconductive bridge has a top surface below the top surface of the first bond pad;
a via pillar bond pad disposed on the via pillar, wherein the via pillar bond pad and the subsequent bond pad are each disposed on a second dielectric layer, and wherein the second dielectric layer is in contact with the solder-resist layer with openings; and
wherein the via pillar is seated upon a reinforcement via pillar pad that is affixed to the semiconductive bridge.

17. The semiconductive device of claim 16, wherein the via pillar is a ganged via pillar that contacts at least two via pillar bond pads, further including a second via pillar that extends vertically from the semiconductive bridge and that contacts a single via pillar bond pad.

18. The semiconductive device of claim 16, further including a semiconductive device in a die, wherein the semiconductive device in a die is attached to the organic substrate and wherein the semiconductive device in a die is electrically connected to at least the via pillar through the solder-resist layer with openings.

19. The semiconductive device of claim 16, further including:
a first semiconductive device in a die, wherein the first semiconductive device in a die is attached to the organic substrate and wherein the first semiconductive device in a die is electrically connected to at least the via pillar through the solder-resist layer with openings; and
a subsequent semiconductive device in a die, wherein the subsequent semiconductive device in a die is attached to the organic substrate opposite the first semiconductive device in a die, and wherein the subsequent semiconductive device in a die is electrically connected to at least the via pillar through the solder-resist layer with openings.

20. The semiconductive device of claim 16, wherein the semiconductive bridge includes an active surface from which the via pillar extends, further including a through-silicon via (TSV) in the semiconductive bridge, wherein the TSV extends from the active surface and in a direction opposite from the via pillar.

21. A semiconductive device in a package comprising:
an organic substrate, wherein the organic substrate includes a first bond pad, a first via above and on the first bond pad, wherein the first via extends orthogonally from the first bond pad, and a subsequent bond pad above and in electrical connection with the first via, wherein the first via and the first bond pad are an integral first bond pad and via, and wherein the first bond pad has a bottom surface and a top surface;
a solder-resist layer with openings, wherein one opening exposes the subsequent bond pad;
a semiconductive bridge embedded in the organic substrate, wherein the semiconductive bridge includes a via pillar that extends vertically from the semiconductive bridge in the same vertical direction as the first via, wherein the via pillar extends vertically above the first via, and wherein the via pillar has a same width at a top of the via pillar and at a bottom of the via pillar, wherein the semiconductive bridge comprises a silicon substrate and metallization, and wherein the semiconductive bridge has a bottom surface below the bottom surface of the first bond pad, and the semiconductive bridge has a top surface below the top surface of the first bond pad; and
a via pillar bond pad disposed on the via pillar, wherein the via pillar bond pad and the subsequent bond pad are each disposed on a second dielectric layer, and wherein the second dielectric layer is in contact with the solder-resist layer with openings.

22. The semiconductive device of claim 21, wherein the via pillar is a ganged via pillar that contacts at least two via pillar bond pads.

23. The semiconductive device of claim 21, wherein the via pillar is a ganged via pillar that contacts at least two via pillar bond pads, further including a second via pillar that extends vertically from the semiconductive bridge and that contacts a single via pillar bond pad.

24. The semiconductive device of claim 21, further including a semiconductive device in a die, wherein the semiconductive device in a die is attached to the organic substrate and wherein the semiconductive device in a die is electrically connected to at least the via pillar through the solder-resist layer with openings.

* * * * *